United States Patent [19]

Hattori et al.

[11] 4,421,843

[45] Dec. 20, 1983

[54] PROCESS FOR FORMING FILM OF FLUOROALKYL ACRYLATE POLYMER ON SUBSTRATE AND PROCESS FOR PREPARING PATTERNED RESIST FROM THE FILM

[75] Inventors: Shuzo Hattori; Shinzo Morita, both of Nagoya; Tsuneo Fujii, Suita, all of Japan

[73] Assignee: Daikin Kogyo Co., Ltd., Osaka, Japan

[21] Appl. No.: 455,910

[22] Filed: Jan. 6, 1983

Related U.S. Application Data

[62] Division of Ser. No. 310,407, Oct. 9, 1981, Pat. No. 4,382,985.

[30] Foreign Application Priority Data

Oct. 11, 1980 [JP] Japan ............................. 55-142198
Jun. 1, 1981 [JP] Japan ............................. 56-84092
Jun. 1, 1981 [JP] Japan ............................. 56-84093

[51] Int. Cl.³ .................... B05D 3/04; B05D 7/24; B05D 3/14
[52] U.S. Cl. ..................................... 430/322; 427/41
[58] Field of Search ......................... 430/322; 427/41

[56] References Cited

PUBLICATIONS

Morita et al., "Plasma Polymerized Methyl-Methacrylate as an Electron-Beam Resist" *J. Appl. Phys.* 51(7), Jul. 1980, pp. 3938–3941.

*Primary Examiner*—James R. Hoffman
*Attorney, Agent, or Firm*—Armstrong, Nikaido, Marmelstein & Kubovcik

[57] ABSTRACT

A process for forming a fluoroalkyl acrylate polymer film on a substrate by plasma polymerization. The fluoroalkyl acrylate polymer film has a high sensitivity to high energy rays and an excellent resolving power, and is very useful as a resist film. The plasma polymerized film of the invention has little pinholes, and is endurable to dry etching. A patterned resist film is prepared by irradiating the film with high energy rays to form a latent pattern and developing the latent pattern by either a wet process using a solvent or an oxygen or oxygen-containing gas plasma etching. Also, a pattern can be formed in the film by only electron beam irradiation. The pattern formation can be attained by electron beam delineation without development treatment. The pattern formation by electron beam delineation is promoted by heat treating the delineated film at a temperature not less than the glass transition temperature of the polymer under reduced pressure or by treating the delineated film with hydrogen or an inert gas plasma.

4 Claims, 2 Drawing Figures

PROCESS FOR FORMING FILM OF FLUOROALKYL ACRYLATE POLYMER ON SUBSTRATE AND PROCESS FOR PREPARING PATTERNED RESIST FROM THE FILM

This is a division, of application Ser. No. 310,407, filed Oct. 9, 1981, now U.S. Pat. No. 4,382,985.

BACKGROUND OF THE INVENTION

The present invention relates to a process for forming a film of a fluoroalkyl acrylate polymer on a substrate, and more particularly to a process for forming a film useful as a resist. The invention also relates to a process for forming a patterned resist film from the fluoroalkyl acrylate polymer film.

A film of a fluoroalkyl acrylate polymer formed on a substrate is very useful as a film for resist, sine the sensitivity to high energy rays such as electron beams and X-rays is from 10 to 500 times that of polymethyl methacrylate and a $\gamma$ value indicating the resolving power is equal to or higher than that of polymethyl methacrylate and accordingly a resist of a fine pattern can be formed.

The fluoroalkyl acrylate polymer film is usually formed by dissolving the polymer in a suitable solvent, coating the solution thin on a substrate with a spin coater, etc., evaporating the solvent and pre-baking the coating. However, this wet process has the defects that much trouble is required, the loss of the polymer solution is great and moreover the formed film is poor in dry etching resistance.

SUMMARY OF THE INVENTION

It has now been found that a film of a fluoroalkyl acrylate polymer having a good dry etching resistance can be formed without requiring trouble and losing materials by utilizing a plasma polymerization of a fluoroalkyl acrylate.

In accordance with the present invention, there is provided a process for forming a polymer film on a substrate which comprises polymerizing a fluoroalkyl acrylate having the following general formula:

$$R_f R^2 OCOCR^1 = CH_2$$

wherein $R_f$ is a $C_1$ to $C_{15}$ straight or branched perfluoroalkyl group in which at least one of the fluorine atoms is substituted by hydrogen atom and which has at least one fluorine atom, $R^1$ is hydrogen atom, methyl group, ethyl group or a halogen atom, and $R^2$ is a bivalent hydrocarbon group, by the action of an inert gas excited by glow discharge in the presence of a substrate so as to form a polymer on the substrate in the form of film.

The process can form directly on the substrate a thin film of a polymer of a fluoroalkyl acrylate from the fluoroalkyl acrylate monomer, and therefore is trouble saving. The formed film is sensitive to high energy rays and is delineable therewith. Also, the film has little pinholes and is resistant to dry etching, and for instance, the delineated film can be developed by a plasma etching. A patterned resist can be formed by imagewise irradiation of high energy rays and development of the latent images.

Accordingly, the present invention also provides a process for forming a patterned resist film on a substrate which comprises (a) forming a film of a polymer on a substrate by polymerizing a fluoroalkyl acrylate having the following general formula:

$$R_f R^2 OCOCR^1 = CH_2$$

wherein $R_f$, $R^1$ and $R^2$ are as defined above, by the action of an inert gas excited by glow discharge in the presence of the substrate, (b) radiating high energy rays to the film to form a latent pattern, and (c) developing the latent pattern.

DETAILED DESCRIPTION

Figure 1:
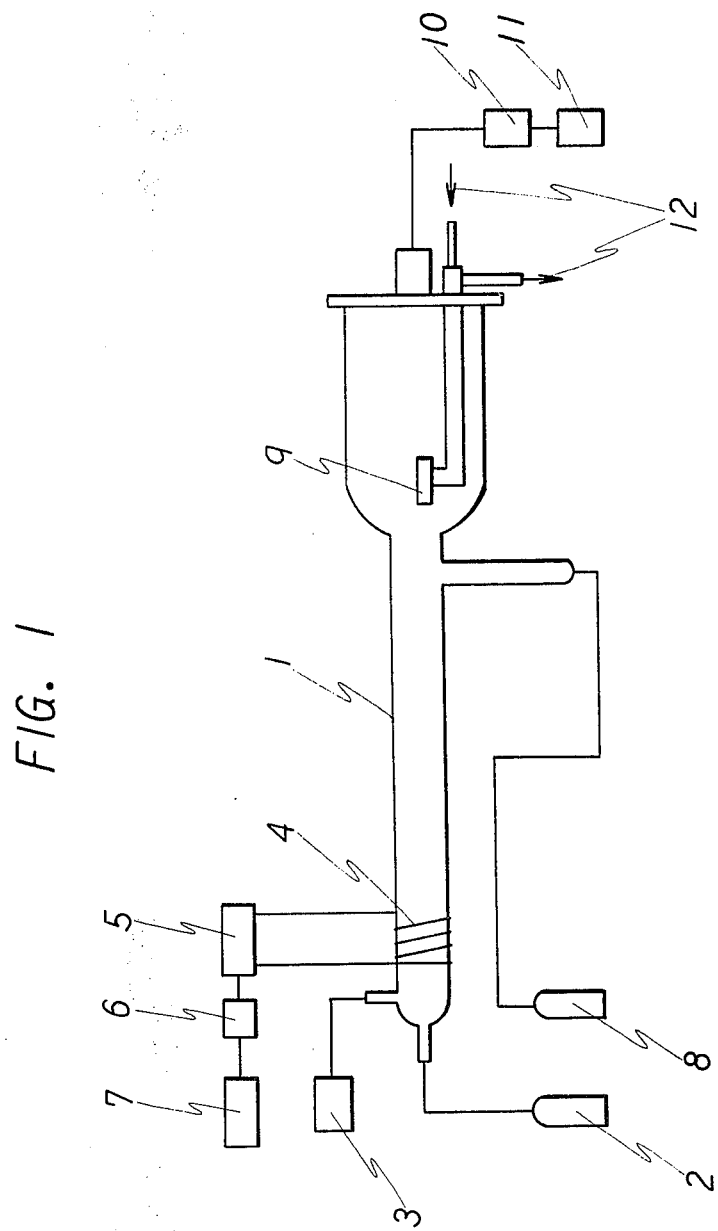
FIG. 1 is an illustrative view showing an instance of apparatuses used for forming a polymer film on a substrate by plasma polymerization according to the process of the present invention.

Fluoroalkyl acrylates shown by the above-mentioned general formula are employed in the present invention. In the general formula, the $R_f$ group is a straight or branched fluoroalkyl or a perfluoroalkyl group. The number of carbon atoms of the $R_f$ group is from 1 to 15, preferably 1 to 10, and also the number of fluorine atoms of the $R_f$ group is at least one, preferably at least half the sum of the carbon atoms of the $R_f$ and $R^2$ groups. The $R^2$ group is a bivalent hydrocarbon group for linking the $R_f$ group to the $CH_2=CR^1COO$ group, and it is desirable that the number of carbon atoms of the $R^2$ group is from 1 to 10, especially 1 to 5, but is not critical. Preferable fluoroalkyl acrylates are those having a boiling point of not more than 400° C. at atmospheric pressure or a boiling point of not more than 70° C. at 40 Torrs. Typical examples of the fluoroalkyl acrylate used in the present invention are given below.

$CH_2=C(CH_3)COOCH_2(CF_2)_2H$
$CH_2=C(CH_3)COOC(CH_3)_2(CF_2)_2H$
$CH_2=C(CH_3)COOCH_2CHFCF_3$
$CH_2=C(CH_3)COOCH_2CF_2CHFCF_3$
$CH_2=C(CH_3)COOCH(CH_3)CF_2CHFCF_3$
$CH_2=C(CH_3)COOCH(C_2H_5)CF_2CHFCF_3$
$CH_2=C(CH_3)COOCH(C_3H_7)CF_2CHFCF_3$
$CH_2=C(CH_3)COOC(CH_3)_2CF_2CHFCF_3$
$CH_2=C(CH_3)COOC(CH_3)(C_2H_5)CF_2CHFCF_3$
$CH_2=C(CH_3)COOCH_2(CF_2CF_2)_nH$ (n=2 to 5)
$CH_2=C(CH_3)COOC(CH_3)_2(CF_2CF_2)_nH$ (n=2 to 5)
$CH_2=C(CH_3)COOC(CH_3)_2CF_2CH(CF_3)_2$
$CH_2=C(CH_3)COOCH_2CH_2(CF_2CF_2)_nCF(CF_3)_2$ (n=1 to 5)
$CH_2=C(CH_3)COOCH_2CH_2(CF_2)_nF$ (n=1 to 10)

The fluoroalkyl acrylates may be employed alone or in admixture thereof. It is also possible to employ the fluoroalkyl acrylates with other vinyl monomers. The vinyl monomer is employed in an amount up to 30% by mole based on the total amount of the fluoroalkyl acrylate and the vinyl monomer.

Examples of the vinyl monomer used in the present invention are, for instance, an ethylenically unsaturated olefin such as ethylene, propylene, butylene, isobutylene or butadiene, a styrene compound such as styrene, α-methylstyrene or p-chlorostyrene, an unsaturated carboxylic acid such as acrylic acid, methacrylic acid, itaconic acid, maleic acid or maleic anhydride, an α-methylene aliphatic monocarboxylic acid ester such as methyl acrylate, ethyl acrylate, n-butyl acrylate, isobutyl acrylate, dodecyl acrylate, n-octyl acrylate, 2- chloroethyl acrylate, phenyl acrylate, methyl α-chloroacrylate, methyl methacrylate, ethyl methacrylate, butyl methacrylate or ethyl α-ethylacrylate, a vinyl ether such as vinyl methyl ether, vinyl ethyl ether or vinyl isobutyl ether, a vinyl halide such as vinyl chloride, a vinyl ester such as vinyl acetate, vinyl propionate, vinyl butyrate or vinyl benzoate, an ethylene derivative such as 1-methyl-1'-methoxyethylene, 1,1-dimethoxyethylene, 1,1'-dimethoxyethylene, 1,1'-dimethoxycarbonylethylene or 1-methyl-1'-nitroethylene, a N-vinyl compound such as N-vinylpyrrole, N-vinylcarbazole, N-vinylindole, N-vinylpyridine or N-vinylpyrrolidone, acrylonitrile, methacrylonitrile, acrylamide, methacrylamide, α-ethylacrylamide, acrylic acid anilide, p-chloroacrylic acid anilide, m-nitroacrylic acid anilide, m-methoxyacrylic acid anilide, vinylidene chloride and vinylidene cyanide.

The fluoroalkyl acrylates used in the present invention can be prepared in a known manner, e.g. by reacting a fluoroalcohol with acrylic or methacrylic acid or a derivative thereof as shown by the following reaction formula:

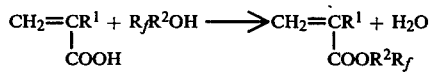

wherein $R^1$, $R^2$ and $R_f$ are as defined above. For instance, 2,2,3,4,4,4-hexafluorobutyl methacrylate is prepared by reacting 2,2,3,4,4,4-hexafluorobutyl alcohol with methacryloyl chloride in the presence of a slight amount of a polymerization inhibitor such as hydroquinone dimethyl ether at a temperature of 60° to 120° C.

The substrates used in the present invention are not limited to specified ones, and there are exemplified, for instance, NaCl crystal, a glass plate masked with chromium, a semiconductor film such as silicon or germanium, a conductor film such as chromium, aluminum, titanium or gold, and insulator film such as phosphosilicate glass, arsenosilicate glass or a borosilicate glass.

A fluoroalkyl acrylate or a mixture of the fluoroalkyl acrylate and a vinyl monomer is polymerized by the action of an inert gas excited by glow discharge, namely by plasma polymerization technique. The excited inert gas is obtained by passing an inert gas through a glow discharge region at a temperature of 0° to 200° C. under a pressure of 10 to $10^{-4}$ Torr, preferably 1 to $10^{-2}$ Torr. Examples of the inert gas are helium, neon, argon, krypton and xenon, and argon and krypton are preferably employed. The glow discharge is carried out by applying a high frequency voltage to two flat electrodes provided in parallel in an evacuable vessel, or by passing a high frequency current through an induction coil provided outside an evacuable vessel. It is desirable to carry out the glow discharge at a discharge frequency of 0.1 to 100 MHz and a discharge power of 1 to 500 W, especially 5 to 50 W, per liter of the vessel. The plasma polymerization is carried out in the evacuable vessel, either by placing a substrate in a stream of a low pressure mixed gas of a monomer and an inert gas and conducting the glow discharge at the surroundings of the substrate, or by placing a substrate in a stream of a low pressure mixed gas of a monomer and an inert gas excited by glow discharge (after-glow discharge method), whereby a produced polymer is deposited on the substrate in the form of a film. The flow rate of an inert gas is, for instance, selected from 0.1 to 200, especially 10 to 200 cm.³STP/min. per liter of the vessel volume. The monomer is supplied to the vessel at a flow rate of 0.5 to 50%, especially 1 to 20%, of the inert gas flow rate. The discharge time is suitably selected according to the desired thickness of the polymer film.

The plasma polymerization is, for instance, carried out by employing an apparatus as shown in FIG. 1. The pressure in a vacuum vessel 1 is controlled by a vacuum pump 11 through a liquid nitrogen trap 10 at a prescribed pressure which is measured with a McLeod vacuum gage 3. A substrate is mounted on a substrate holder 9 cooled by water 12. The glow discharge is generated by an induction coil 4 connected to a radio-frequency generator 7 through an impedance matching unit 5 and a wattmeter 6. An inert gas is introduced from an inert gas reservoir 2 into the vessel 1 and is passed through the glow discharge region so as to be excited. On the other hand, a monomer is introduced from a monomer reservoir 8 into the after-glow region. A polymer is produced on the substrate to form a film.

The thus formed polymer film may be pre-baked with the substrate at a temperature of 70° to 200° C., if necessary.

The plasma polymerized film of the present invention can be delineated by irradiation of high energy rays. A latent pattern is formed in the film in a usual delineation manner. The film pre-baked or not pre-baked is patternwise irradiated with high energy rays such as electron beams, X-rays and deep ultraviolet rays. The delineation conditions depend on the kind of the high energy rays, the kind of the polymer and the thickness of the polymer film.

A resist film having a fine, precise pattern is obtained by the development of the latent pattern. The development can be carried out by a usual wet developing method in which the portion irradiated with high energy rays is eluted with a solvent. Examples of the solvent used as a developer are, for instance, alcohols having 3 to 6 carbon atoms, methyl isobutyl ketone, methyl ethyl ketone, and the like. In addition to the wet development, the film of the present invention can be developed by a plasma etching. The plasma development is very advantageous in that all procedures from the film formation to the pattened resist film formation can be conducted by a dry process. The plasma development of the latent image is carried out in an oxygen or oxygen-containing atmosphere at a temperature of 0° to 100° C. and a gas pressure of 1 to 500 mTorr in such a manner that a delineated polymer film formed on a substrate is placed in a glow discharge region, for instance, on one of two flat circular electrodes set in paralle, if necessary, with insulation, to which oxygen or an oxygen-containing gas is passed. Preferably, oxygen is admixed with an inert gas such as argon. The oxygen concentration in the mixed gas, e.g. Ar-$O_2$ mixed gas, is from 10 to 20% by mole. The mixed gas is usually passed at a flow rate of 10 to 100 cm.³STP/min. per 3 liters of vessel volume. The discharge power is from 0.2 to 2 W per cubic centimeter of the volume between two electrodes.

It has also been found that the development of the latent pattern formed in the resist film by delineation with high energy rays is done by only electron beam irradiation, and a patterned resist film can be directly prepared from the plasma polymerized resist film by patternwise electron beam irradiation without conducting a developing treatment such as oxygen plasma development. A pattern is formed in the plasma polymerized film on a substrate merely by radiating electron beams to the film pre-baked or not pre-baked. The electron beam radiation is carried out in vacuo of $10^{-4}$ to $10^{-7}$ Torr, preferably $10^{-5}$ to $10^{-6}$ Torr. The electron beam dose is suitably selected in accordance with the kind of a polymer and the thickness of a film. For instance, in case of a film having a thickenss of 0.1 μm., the electron beam dose is about 30 μC./cm.$^2$, and in case of a film having a thickness of 0.2 μm., the electron beam dose is about 50 μC./cm.$^2$ The electron beam dose per unit thickness depends on the film thickness, and in case that the film thickness is more than 0.2 μm., electron beam dose of 200 μC./cm.$^2$ per 1 μm. in thickness is sufficient for pattern formation.

The pattern formation by only electron beam irradiation can be promoted by after the electron beam irradiation of a resist film, either heating the film at a temperature of not less than the glass transition temperature of the polymer under reduced pressure or treating the film with a plasma of hydrogen or an inert gas. Therefore, it is also possible to conduct the development of a latent pattern by means of such a heat or plasma treatment.

In case of preparing a patterned resist film on a substrate by a process in which a latent pattern is formed by irradiation of high energy rays such as electron beams and then developed by an oxygen plasma treatment, the portion unirradiated by electron beams is also etched somewhat in plasma treatment. In contrast to this process, in the direct processes, i.e. the pattern formation techniques by only the electron beam radiation and by the electron beam radration followed by the promoting treatment, such an undesirable etching phenomenon is a far little, and a more sharp pattern can be obtained. Also, the direct process combined with the promoting treatment can decrease the amount of the electron beam radiation as compared with the direct process by only the electrom beam radiation, and accordingly the electron beam radiation time can be shortened.

In case of the promoting treatment with heating, the treatment is carried out under reduced pressure of 1 to $10^{-5}$ Torr, preferably $10^{-2}$ to $10^{-3}$ Torr at a temperature that is not less than the glass transition temperature of a polymer and does not cause the thermal decomposition of the polymer, usually within the range of 80° to 250° C.

The promoting treatment with a plasma of hydrogen or an inert gas is carried out at a temperature of 0° to 100° C. under a gas pressure of $10^{-1}$ to $10^{-5}$ Torr, preferably $10^{-2}$ to $10^{-4}$ Torr. A resist polymer film formed on a substrate is placed in a hydrogen or inert gas plasma. For instance, the film-supporting substrate is mounted on one electrode of two parallel electrodes for plasma discharge so that the film faces another electrode. If necessary, the substrate is insulated from the electrode. As an inert gas, there are employed, for instance, argon, helium, nitrogen, and the like. The flow rate of hydrogen or an inert gas is usually selected from 0.1 to 10 cm.$^3$STP/min. per 3 liters of a vessel volume, and the discharge is carried out at a discharge power of 0.05 to 1 W per cubic centimeter of the volume between two electrodes. The discharge time is suitably selected in accordance with the preceding electron beam radiation condition, the polymer kind, the film thickness, and the like.

The patterned resist film prepared according to the process of the present invention is applicable to the preparation of semiconductor elements, magnetic bubble elements, optical devices, videodisc, and the like.

The present invention is more specifically described and explained by means of the following Examples.

EXAMPLE 1

A film of a polymer of a fluoroalkyl acrylate monomer was formed on a substrate by employing a plasma polymerization apparatus shown in FIG. 1 as follows:

A one liter vacuum vessel 1 was evacuated by a vacuum pump 11 through a liquid nitrogen trap 10, and the pressure was adjusted at 0.7 Torr with measurement by a McLeod vacuum gage 3. Argon was introduced from an argon reservoir 2 into the end of the vessel 1 at 63.5 cm.$^3$STP/min., and was excited by passing through a glow discharge region generated by an induction coil 4 to which a 13.56 MHz radio-frequency power was delivered from a radio-frequency generator 7 through an impedance matching circuit 5. The discharge power was measured by a wattmeter 6. On the other hand, a fluoroalkyl acrylate monomer was introduced from a monomer reservoir 8 into the after-glow region of the vessel 1 at a flow rate of 2.1 cm.$^3$STP/min. and was joined with the excited argon, and they were brought into contact with a substrate (not shown) mounted on a substrate holder 9 cooled with water 12, while evacuating by vacuum pump 11.

The film formation was carried out under the following conditions.

Figure 2:
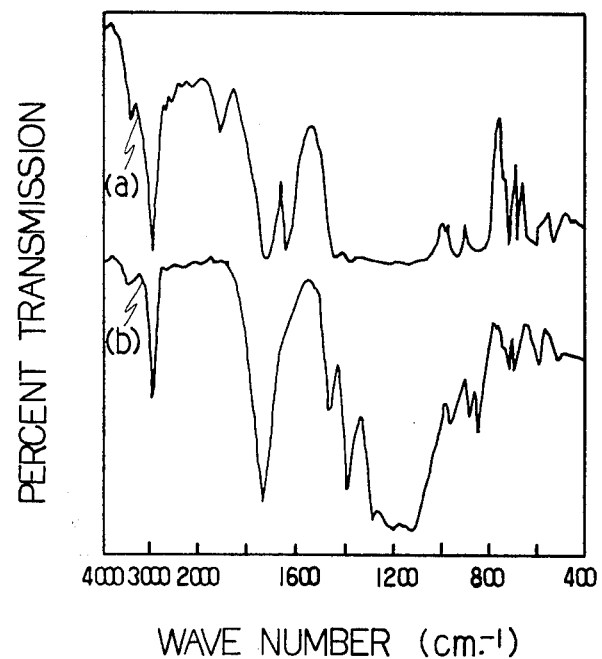
FIG. 2 is infrared absorption spectrums of a fluoroalkyl acrylate monomer and a polymer film of the invention prepared therefrom.

Monomer: 2,2,3,4,4,4-hexafluorobutyl methacrylate
Substrate: NaCl crystal
Surrounding temp. of apparatus: room temperature (25° C.)
Glow discharge power: 30 W
Argon flow rate: 63.5 cm.$^3$STP/min.
Monomer flow rate: 2.1 cm.$^3$STP/min.
Discharge time: 4 hours In FIG. 2, there is shown an infrared absorption spectrum (b) of the NaCl crystal so brought into contact with the excited argon and the monomer. Comparing it with an infrared absorption spectrum (a) of 2,2,3,4,4,4-hexafluorobutyl methacrylate monomer, there was observed changes such as disappearance of two peaks at 1900 cm.$^{-1}$ and 1640 cm.$^{-1}$ and it was confirmed that a polymer film of 2,2,3,4,4,4-hexafluorobutyl methacrylate was formed on the NaCl crystal.

EXAMPLES 2 AND 3

Films of polymers of the monomer shown in Table 1 were formed on substrates by employing the plasma polymerization apparatus shown in FIG. 1, and the film formation rate and the film thickness were measured. They were obtained on the basis of the weight change of the substrate before and after film formation with regarding the specific gravity of the polymers as 1.57.

Further, patterns were delineated by radiating electron beams to the obtained films, and was developed by a plasma etching. The sensitivity and γ value of the film were measured. The plasma etching development was carried out by employing an apparatus having two flat circular electrodes (diameter: 100 mm., distance between two electrodes: 30 mm.) cooled with water, in which a substrate was mounted on the under elctrode and the high frequency voltage of 13.56 MHz was applied to the electrodes.

The conditions of the plasma polymerization, the electron beam delineation and the plasma development and the results are shown in Table 1.

TABLE 1

| Example No. | 2 | 3 |
|---|---|---|
| Film formation condition | | |
| Monomer | 2,2,3,4,4,4-hexafluorobutyl methacrylate | 1,1-dimethyl-2,2,3,3-tetrafluoropropyl methacrylate |
| Substrate | Cr film plated on glass plate | Cr film plated on glass plate |
| Surrounding temp. of apparatus | room temp. (25° C.) | room temp. (25° C.) |
| Gas pressure in vessel (Torr) | 0.7 | 0.7 |
| Glow discharge power (W) | 10 | 10 |
| Ar flow rate (cm.$^3$STP/min.) | 63.5 | 63.5 |
| Monomer flow rate (cm.$^3$STP/min.) | 1.6 | 2.4 |
| Discharge time (hour) | 2 | 2 |
| Result of film formation | | |
| Film formation rate (μm./hour) | 2.7 | 4.1 |
| Film thickness (μm.) | 5.4 | 8.1 |
| Electron beam delineation condition | | |
| Acceleration voltage (kV) | 20 | 20 |
| Electron dose (μC./cm.$^2$) | 10, 30, 50, 70, 100, 150, 200 and 300 | |
| Plasma development condition | | |
| Discharge power (W) | 100 | 100 |
| Gas composition (molar ratio) | Ar: $O_2$ = 4:1 | Ar: $O_2$ = 4:1 |
| Gas pressure (mTorr) | 2 | 2 |
| Gas flow rate (cm.$^3$STP/min.) | 30 | 30 |
| Discharge time (hour) | 20 | 20 |
| Results | | |
| Sensitivity of film (μC./cm.$^2$) | 80 to 150 | 60 to 150 |
| γ value of film | about 2 | about 2 |

EXAMPLES 4 TO 7

Films of fluoroalkyl acrylate polymers were formed on chromium films plated on glass plates, and the electron beam delineation and plasma etching development were carried out according to the procedures of Examples 2 and 3.

The conditions and the results are shown in Table 2.

TABLE 2

| Example No. | 4 | 5 | 6 | 7 |
|---|---|---|---|---|
| Film formation condition | | | | |
| Monomer | $CH_2=C(CH_3)COOCH_2-(CF_2)_4H$ | $CH_2=C(CH_3)COOCH(C_3H_7)CF_2CHF(CF_3)$ | $CH_2=C(CH_3)COOCH_2-(CF_2)_2H$ | $CH_2=C(CH_3)COO(C_2)_2-(CF_2)_2CFCF_3 \mid CF_3$ |
| Surrounding temp. of apparatus | room temp. | room temp. | room temp. | room temp. |
| Gas pressure in vessel (Torr) | 0.7 | 0.7 | 0.7 | 0.7 |
| Glow discharge power (W) | 10 | 10 | 10 | 10 |
| Ar flow rate (cm.$^3$ STP/min.) | 63.5 | 63.5 | 63.5 | 63.5 |
| Monomer flow rate (cm.$^3$ STP/min.) | 2.1 | 0.8 | 3.5 | 2.2 |
| Discharge time (hour) | 2 | 2 | 2 | 2 |
| Results of film formation | | | | |
| Film formation rate (μm./hour) | 3.5 | 1.3 | 5.1 | 2.7 |
| Film thickness (μm.) | 7.0 | 2.6 | 10.1 | 5.5 |
| Electron beam delineation condition | | | | |
| Acceleration voltage (kV) | 20 | 20 | 20 | 20 |
| Radiation current (A) | $1 \times 10^{-9}$ | $1 \times 10^{-9}$ | $1 \times 10^{-9}$ | $1 \times 10^{-9}$ |
| Plasma development condition | | | | |
| Discharge power (W) | 100 | 100 | 100 | 100 |
| Gas composition (molar ratio) | Ar/$O_2$ = 4/1 | Ar/$O_2$ = 4/1 | Ar/$O_2$ = 4/1 | Ar/$O_2$ = 4/1 |
| Gas pressure (mTorr) | 2 | 2 | 2 | 2 |
| Gas flow rate (cm.$^3$ STP/min.) | 30 | 30 | 30 | 30 |
| Discharge time (hour) | 20 | 20 | 20 | 20 |
| Results | | | | |
| Sensitivity of film (μC./cm.$^2$) | 150–250 | 70–130 | 50–90 | 150–250 |

TABLE 2-continued

| Example No. | 4 | 5 | 6 | 7 |
|---|---|---|---|---|
| γ value of film | about 2 | about 2.5 | about 1.5 | about 1.5 |

EXAMPLE 8

A film was prepared and delineated by electron beam in the same manner as in Example 2. The development of the delineated film was conducted by immersing the film in a mixed solvent of methyl isobutyl ketone and isopropanol (1:150 by volume) at 23° C. for 120 seconds. The sensitivity was 1.5 $\mu$C./cm.$^2$ and the γ value was 4.5. The obtained resist film was an excellent film free from pinholes in spite of no pre-baking of the plasma polymerized film.

EXAMPLE 9

A film was formed on a glass plate coated with chromium under the following plasma polymerization conditions according to the procedure of Example 1.
Monomer: 2,2,3,4,4,4-hexafluorobutyl methacrylate
Substrate: Cr film plated on glass plate
Surrounding temp. of apparatus: room temperature
Gas pressure in vessel: 0.7 Torr
Glow discharge power: 10 W
Argon flow rate: 63.5 cm.$^3$STP/min.
Monomer flow rate: 1.6 cm.$^3$STP/min.
Discharge time: 1 hour The film thickness which was measured by employing a Talystep (Rank Taylor Hobson, England), was 2.7 $\mu$m.

The electron beam delineation of the film was carried out at $10^{-5}$ to $10^{-6}$ Torr by irradiating electron beam bundles of 4×4 $\mu$m. square at intervals of 0.5 $\mu$m. with varied doses of electron to form square patterns, and the degree of the decrease of film thickness to the respective doses were measured. The results are shown below.

| Dose of electron ($\mu$C./cm$^2$.) | Decrease of film thickness ($\mu$m.) |
|---|---|
| 10 | 0.008 |
| 20 | 0.06 |
| 30 | 0.11 |
| 40 | 0.16 |
| 50 | 0.24 |

From the above results, it would be understood that the pattern formation of the plasma polymerized film according to the present invention can be attained by only the electron beam radiation.

EXAMPLE 10

The procedure of Example 9 was repeated except that after the electron beam delineation, the delineated film was further heat-treated at 170° C. and $10^{-3}$ to $10^{-4}$ Torr for 30 minutes. The results of the measurement of the decrease of film thickness are shown below.

| Dose of electron ($\mu$C./cm$^2$.) | Decrease of film thickness ($\mu$m.) |
|---|---|
| 10 | 0.02 |
| 20 | 0.15 |
| 30 | 0.25 |
| 40 | 0.37 |
| 50 | 0.56 |

EXAMPLE 11

The procedure of Example 9 was repeated except that after the electron beam delineation, the delineated film was further treated with hydrogen plasma. The hydrogen plasma treatment was carried out by applying a high frequency voltage of 13.56 MHz to two parallel circular electrodes (diameter: 100 mm., distance between electrodes: 30 mm.), on the under electrode of which the film formed on the Cr film plated on a glass plate was mounted with facing up, while passing hydrogen through the discharge region. The conditions of the hydrogen plasma treatment were as follows:
Discharge power: 100 W
Hydrogen pressure: 2 mTorr
Hydrogen flow rate: 1 to 10 cm.$^3$STP/min.
Discharge time: 10 minutes
The results are shown below.

| Dose of electron ($\mu$C./cm$^2$.) | Decrease of film thickness ($\mu$m.) |
|---|---|
| 10 | 0.02 |
| 20 | 0.14 |
| 30 | 0.24 |
| 40 | 0.35 |
| 50 | 0.53 |

EXAMPLE 12

A polymer film was formed on a substrate under the following plasma polymerization conditions according to the procedure of Example 1.
Monomer: 1,1-dimethyl-2,2,3,3-tetrafluoropropyl methacrylate
Substrate: Cr film plated on glass plate
Surrounding temp. of apparatus: room temperature
Gas pressure in vessel: 0.7 Torr
Glow discharge power: 10 W
Argon flow rate: 63.5 cm.$^3$STP/min.
Monomer flow rate: 2.4 cm.$^3$STP/min.
Descharge time: 1 hour
The thickness of the obtained film which was measured by Talystep was 4.1 $\mu$m.

EXAMPLE 13

A polymer film was formed in the same manner as in Example 12 and the decrease of film thickness by electron beam irradiation was measured in the same manner as in Example 9. The results are shown below.

| Dose of electron ($\mu$C./cm$^2$.) | Decrease of film thickness ($\mu$m.) |
|---|---|
| 10 | 0.008 |
| 20 | 0.05 |
| 30 | 0.09 |
| 40 | 0.13 |

-continued

| Dose of electron ($\mu C./cm^2$.) | Decrease of film thickness ($\mu m$.) |
| --- | --- |
| 50 | 0.20 |

EXAMPLE 14

The procedure of Example 13 was repeated except that after the electron beam irradiation, the delineated film was further heat-treated at 190° C. and $10^{-3}$ to $10^{-4}$ Torr for 30 minutes. The results are shown below.

| Dose of electron ($\mu C./cm^2$.) | Decrease of film thickness ($\mu m$.) |
| --- | --- |
| 10 | 0.02 |
| 20 | 0.15 |
| 30 | 0.24 |
| 40 | 0.35 |
| 50 | 0.57 |

EXAMPLE 15

The procedure of Example 14 was repeated except that after the electron beam irradiation, the delineated film was further treated with hydrogen plasma. The hydrogen plasma treatment was carried out in the same manner as in Example 11. The results are shown below.

| Dose of electron ($\mu C./cm^2$.) | Decrease of film thickness ($\mu m$.) |
| --- | --- |
| 10 | 0.02 |
| 20 | 0.14 |
| 30 | 0.23 |
| 40 | 0.34 |
| 50 | 0.55 |

What we claim is:

1. A process for forming a patterned resist film on a substrate which comprises (a) forming a film of a polymer on a substrate by polymerizing a fluoroalkyl acrylate having the following general formula:

$$R_f R^2 OCOCR^1 = CH_2$$

wherein $R^1$ is a $C_1$ to $C_{15}$ straight or branched perfluoroalkyl group or a $C_1$ to $C_{15}$ straight or branched perfluoroalkyl group in which at least one of the fluorine atoms is substituted by hydrogen atom and which has at least one fluorine atom, $R^1$ is hydrogen atom, methyl group, ethyl group or a halogen atom, and $R^2$ is a bivalent hydrocarbon group, by the action of an inert gas excited by flow discharge in the presence of a substrate, (b) radiating high energy rays to the film to form a latent pattern, and (c) developing the latent pattern.

2. The process of claim 1, wherein the latent pattern is developed by a plasma etching.

3. The process of claim 1, wherein the developing is carried out by heating the film irradiated by high energy rays at a temperature of not less than the glass transition temperature of the polymer constituting the film under reduced pressure.

4. The process of claim 1, wherein the developing is carried out by treating the film irradiated by high energy rays with a plasma of hydrogen or an inert gas.

* * * * *